(12) United States Patent
Shiozawa et al.

(10) Patent No.: US 7,256,072 B2
(45) Date of Patent: Aug. 14, 2007

(54) SEMICONDUCTOR DEVICE, ELECTRONIC DEVICE, ELECTRONIC APPARATUS, AND METHOD OF MANUFACTURING SEMICONDUCTOR DEVICE

(75) Inventors: Masakuni Shiozawa, Sakata (JP); Akiyoshi Aoyagi, Atsugi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/346,533

(22) Filed: Feb. 2, 2006

(65) Prior Publication Data
US 2006/0125096 A1 Jun. 15, 2006

Related U.S. Application Data

(62) Division of application No. 11/093,128, filed on Mar. 29, 2005, now abandoned, which is a division of application No. 10/807,541, filed on Mar. 23, 2004, now abandoned.

(30) Foreign Application Priority Data

Mar. 25, 2003 (JP) .............................. 2003-083070
May 22, 2003 (JP) .............................. 2003-145199

(51) Int. Cl.
  *H01L 21/44* (2006.01)
(52) U.S. Cl. .............................. 438/109; 257/E21.011
(58) Field of Classification Search .................. 438/6, 438/10, 104, 107–114, 118, 121–123, 128–129, 438/135, 142, 145, 149, 151, 157, 176, 478, 438/184, 193, 195–198, 200–203, 206–207, 438/209–211, 218, 237, 165, 294, 308, 337, 438/353
See application file for complete search history.

(56) References Cited

U.S. PATENT DOCUMENTS

| | | | |
|---|---|---|---|
| 5,120,678 A | 6/1992 | Moore et al. | |
| 5,222,014 A | 6/1993 | Lin | |
| 5,340,771 A | 8/1994 | Rostoker | |
| 5,755,374 A | 5/1998 | Prigmore | |
| 5,834,848 A | 11/1998 | Iwasaki | |
| 5,973,392 A | 10/1999 | Senba | |

(Continued)

FOREIGN PATENT DOCUMENTS

JP          06-013541          1/1994

(Continued)

OTHER PUBLICATIONS

Communication from Japanese Patent Office regarding related application.

(Continued)

*Primary Examiner*—Walter Lindsay, Jr.
*Assistant Examiner*—Andre' Stevenson
(74) *Attorney, Agent, or Firm*—Harness, Dickey & Pierce, P.L.C.

(57) ABSTRACT

A method is provided to suppress detachment between semiconductor packages while preventing dislocation at the time of mounting a stacked semiconductor package on a motherboard. Semiconductor packages PK1 and PK2 are bonded to each other through protruding electrodes and resin is provided between the semiconductor packages PK1 and PK2. The resin is provided in the peripheries of the protruding electrodes so as to contact each of the protruding electrodes while not contacting a semiconductor chip.

2 Claims, 9 Drawing Sheets

U.S. PATENT DOCUMENTS

| | | | |
|---|---|---|---|
| 6,023,097 A | | 2/2000 | Chiang et al. |
| 6,025,648 A | * | 2/2000 | Takahashi et al. .......... 257/778 |
| 6,025,650 A | | 2/2000 | Tsuji et al. |
| 6,034,425 A | | 3/2000 | Chiang et al. |
| 6,051,878 A | * | 4/2000 | Akram et al. ................ 257/686 |
| 6,122,171 A | | 9/2000 | Akram et al. |
| 6,239,383 B1 | | 5/2001 | Lin |
| 6,288,445 B1 | | 9/2001 | Kimura |
| 6,369,444 B1 | | 4/2002 | Degani et al. |
| 6,369,448 B1 | * | 4/2002 | McCormick .................. 257/777 |
| 6,404,049 B1 | | 6/2002 | Shibamoto et al. |
| 6,442,026 B2 | | 8/2002 | Yamaoka |
| 6,461,881 B1 | | 10/2002 | Farnworth et al. |
| 6,489,678 B1 | | 12/2002 | Joshi |
| 6,493,229 B2 | * | 12/2002 | Akram et al. ................ 361/704 |
| 6,501,165 B1 | * | 12/2002 | Farnworth et al. .......... 257/686 |
| 6,507,098 B1 | | 1/2003 | Lo et al. |
| 6,531,341 B1 | * | 3/2003 | Peterson et al. ............. 438/123 |
| 6,573,119 B1 | | 6/2003 | Hirashima et al. |
| 6,586,832 B2 | | 7/2003 | Shibata et al. |
| 6,611,063 B1 | | 8/2003 | Ichinose et al. |
| 6,627,991 B1 | | 9/2003 | Joshi |
| 6,670,264 B2 | | 12/2003 | Sakuyama et al. |
| 6,731,009 B1 | | 5/2004 | Jones et al. |
| 6,774,467 B2 | | 8/2004 | Horiuchi et al. |
| 6,781,241 B2 | * | 8/2004 | Nishimura et al. .......... 257/777 |
| 6,787,916 B2 | * | 9/2004 | Halahan ...................... 257/777 |
| 6,882,232 B2 | | 4/2005 | Harima |
| 6,900,074 B2 | * | 5/2005 | Miyamoto et al. .......... 438/108 |
| 6,903,458 B1 | | 6/2005 | Nathan |
| 2001/0015488 A1 | | 8/2001 | Akram et al. |
| 2001/0025874 A1 | | 10/2001 | Nishiyama |
| 2002/0017709 A1 | | 2/2002 | Yanagisawa et al. |
| 2002/0079568 A1 | | 6/2002 | Degani et al. |
| 2003/0022465 A1 | | 1/2003 | Wachtler |
| 2003/0162324 A1 | * | 8/2003 | Tomimatsu .................. 438/109 |
| 2003/0197260 A1 | * | 10/2003 | Nishimura et al. .......... 257/686 |
| 2004/0101993 A1 | * | 5/2004 | Salmon ...................... 438/107 |
| 2004/0106229 A1 | * | 6/2004 | Jiang et al. .................. 438/106 |
| 2004/0135243 A1 | | 7/2004 | Aoyagi |
| 2004/0222510 A1 | | 11/2004 | Aoyagi |
| 2004/0238954 A1 | | 12/2004 | Miyaji et al. |

FOREIGN PATENT DOCUMENTS

| | | |
|---|---|---|
| JP | 07-183426 | 7/1995 |
| JP | 09-092685 | 4/1997 |
| JP | 09-283697 | 10/1997 |
| JP | 10-084076 | 3/1998 |
| JP | 10-340928 | 12/1998 |
| JP | 11-307717 | 11/1999 |
| JP | 2000-040713 | 2/2000 |
| JP | 2000-286380 | 10/2000 |
| JP | 2001-015633 | 1/2001 |
| JP | 2001-110979 | 4/2001 |
| JP | 2001-223297 | 8/2001 |
| JP | 2001-284382 | 10/2001 |
| JP | 2002-057273 | 2/2002 |
| JP | 2002-134661 | 5/2002 |
| JP | 2002-329813 | 11/2002 |
| JP | 2002-353272 | 12/2002 |
| JP | 2003-007972 | 1/2003 |
| JP | 2003-318361 | 11/2003 |
| JP | 2004-079923 | 3/2004 |
| JP | 2004-214403 | 7/2004 |
| JP | 2004-265955 | 9/2004 |
| JP | 2004-273938 | 9/2004 |

OTHER PUBLICATIONS

Communication from Japanese Patent Office regarding counterpart application.
US 6,120,855, 09/2000, Call et al. (withdrawn)

* cited by examiner

SEMICONDUCTOR DEVICE, ELECTRONIC DEVICE, ELECTRONIC APPARATUS, AND METHOD OF MANUFACTURING SEMICONDUCTOR DEVICE

CROSS REFERENCE TO RELATED APPLICATIONS

This application is a divisional patent application of U.S. Ser. No. 11/093,128 filed Mar. 29, 2005 now abandoned, which is a divisional patent application of U.S. Ser. No. 10/807,541 filed Mar. 23, 2004 now abandoned, claiming priority to Japanese Patent Application Nos. 2003-083070 filed Mar. 25, 2003 and 2003-145199 filed May 22, 2003 which are hereby expressly incorporated by reference herein in their entireties.

BACKGROUND

1. Field of the Invention

The present invention relates to a semiconductor device, an electronic device, an electronic apparatus, and a method of manufacturing a semiconductor device, and particularly to those suitable for being applied to a stacked structure of a semiconductor package.

2. Description of the Related Art

As for the conventional semiconductor package, there has been attempting to save space by stacking semiconductor packages through solder balls, for example, as disclosed in Japanese laid-open patent publication No. 6-13541. In order to prevent displacement caused by solder balls between the semiconductor packages being re-melted at the time of mounting a stacked semiconductor package on a motherboard, resin is filled between stacked semiconductor packages.

However, as for a conventional semiconductor package, resin is filled in the whole gap between semiconductor packages that are stacked through solder balls. For this reason, when curing the resin that is filled between semiconductor packages, moisture contained in the resin does not fully drain out, and thus the moisture remains in the resin that is filled between the semiconductor packages. Therefore, when executing re-reflow at the time of mounting a stacked semiconductor package on a motherboard, there has been a problem in that moisture contained in the resin, which is filled between the semiconductor packages, evaporates to expand, thereby causing detachment between the semiconductor packages.

The present invention is intended to provide a semiconductor device, an electronic device, an electronic apparatus, and a method of manufacturing a semiconductor device, which can prevent detachment between semiconductor packages while preventing displacement at the time of mounting a stacked semiconductor package on the motherboard.

SUMMARY

In order to solve the above-described problem, a semiconductor device according to the present invention includes a first semiconductor package where a first semiconductor chip is mounted, a second semiconductor package where a second semiconductor chip is mounted, and a protruding electrode bonding the first semiconductor package and the second semiconductor package so that the second semiconductor package is held above the first semiconductor chip. The semiconductor device also includes resin that is provided so as to avoid at least a part of the surface of the first semiconductor chip and provided between the first semiconductor package and the second semiconductor package.

Accordingly, the resin can be filled between the first semiconductor package and the second semiconductor package so as to leave a gap between the first semiconductor package and the second semiconductor package, which are bonded through the protruding electrodes. Therefore, the moisture contained in the resin between the first semiconductor package and the second semiconductor package can be easily drained out, thereby expansion of the resin between the first semiconductor package and the second semiconductor package can be suppressed when executing re-reflow at the time of mounting a first semiconductor package on a motherboard. As a result, detachment between the first semiconductor package and the second semiconductor package can be prevented, while enabling the first semiconductor package to be fixed to the second semiconductor package by resin. Moreover, even when executing re-reflow of the protruding electrodes at the time of mounting the first semiconductor package on the mother board, displacement between the first semiconductor package and the second semiconductor package can be prevented.

Moreover, as for a semiconductor device according to an embodiment of the present invention, the protruding electrode is a solder ball. Accordingly, the first semiconductor package can be electrically coupled to the second semiconductor package by executing a reflow process, thereby enabling the second semiconductor package to be efficiently mounted on the first semiconductor package.

Moreover, as for a semiconductor device according to an embodiment of the present invention, the resin is arranged between the first semiconductor package and the second semiconductor package so as not to contact the protruding electrodes. Accordingly, the resin can be filled between the first semiconductor package and the second semiconductor package, leaving a gap between the first semiconductor package and the second semiconductor package that are bonded through the protruding electrodes. Moreover, thermal damage can be suppressed even when executing a reflow process of the protruding electrode. Therefore, the resin having lower thermal resistance can be selected and low hygroscopic resin can be selected, thereby suppressing detachment between semiconductor packages while preventing displacement of the stacked semiconductor package at the time of mounting the stacked semiconductor package on a mother board.

Moreover, as for a semiconductor device according to an embodiment of the present invention, the resin is arranged only at the corners of the second semiconductor package. Accordingly, even when the gap between the first semiconductor package and the second semiconductor package is narrow, resin can be filled between the first semiconductor package and the second semiconductor package. Therefore, displacement of a stacked semiconductor package at the time of mounting the first semiconductor package on a mother board can be prevented, and detachment between semiconductor packages can be suppressed, while suppressing complication of the manufacturing process.

As for a semiconductor device according to an embodiment of the present invention, on the first semiconductor package and the second semiconductor package, a region without a protruding electrode corresponding to the positions for arranging the resin is provided. Accordingly, even when a protruding electrode is densely arranged, resin can be filled between the first semiconductor package and the second semiconductor package without contacting the protruding electrode. Therefore, multi-pin packaging can be supported, while enabling the prevention of displacement of the stacked semiconductor package at the time of mounting the stacked semiconductor package on a mother board, and detachment between semiconductor packages can be suppressed.

As for a semiconductor device according to an embodiment of the present invention, the resin is arranged to contact the peripheries of the protruding electrodes. Accordingly, even when resin is provided between the first semiconductor package and the second semiconductor package so as to leave a gap between the first semiconductor package and the second semiconductor package, it is not necessary to provide a gap between the resin and the protruding electrode. For this reason, it is not necessary to secure a separate region for arranging resin against the protruding electrode, and thus the resin can be filled between the first semiconductor package and the second semiconductor package without affecting the arrangement of the protruding electrode. Consequently, displacement at the time of mounting a stacked semiconductor package on a motherboard can be prevented and detachment between semiconductor packages can be suppressed, while suppressing the reduction of the number of the arranged protruding electrodes.

Moreover, as for a semiconductor device according to an embodiment of the present invention, the resin includes flux. This enables the resin to crawl (e.g., move, migrate, etc.) up the periphery of the solder at the time of solder reflow, while enabling the stable execution of solder bonding. For this reason, resin can be arranged to contact the peripheries of the protruding electrode, and thus detachment between the semiconductor packages can be suppressed while enabling the prevention of displacement at the time of mounting the stacked semiconductor package on a motherboard without complicating the manufacturing process.

Moreover, as for a semiconductor device according to an embodiment of the present invention, the first semiconductor package includes a first carrier substrate and the first semiconductor chip that is flip-chip mounted on the first carrier substrate, and the second semiconductor package includes a second carrier substrate mounted on the first carrier substrate through the protruding electrode so as to be held above the first semiconductor chip, a second semiconductor chip that is mounted on the second carrier substrate and sealing agent that seals the second semiconductor chip.

Accordingly, even when the first semiconductor package and the second semiconductor package are different types, detachment between the first semiconductor package and the second semiconductor package can be suppressed while preventing displacement at the time of secondary packaging of the stacked semiconductor package. Furthermore, connection reliability between the first semiconductor package and the second semiconductor package can be improved while enabling space savings.

As for a semiconductor device according to an embodiment of the present invention, the first semiconductor package is a ball grid array where the first semiconductor chip is flip-chip mounted on the first carrier substrate, and the second semiconductor package is a ball grid array or a chip-size package where the second semiconductor chip mounted on the second carrier substrate is mold-sealed.

Accordingly, even when using a general-purpose package, detachment between the first semiconductor package and the second semiconductor package can be suppressed while preventing displacement at the time of secondary packaging of the stacked semiconductor package, thereby the connection reliability between different types of packages can be improved without deteriorating production efficiency.

Moreover, an electronic device according to an embodiment of the present invention includes a first package where a first electronic component is mounted, a second package where a second electronic component is mounted, and a protruding electrode bonding the first package to the second package so that the second package is held above the first electronic component. The electronic device also includes resin that is provided so as to avoid at least a part of the surface of a first electronic component and is provided between the first package and the second package.

For this reason, the resin can be filled between the first semiconductor package and the second semiconductor package, leaving a gap between the first semiconductor package and the second semiconductor package that are bonded through the protruding electrode. For this reason, detachment between the first package and the second package can be suppressed, while enabling the first package and the second package to be closely fixed with the resin, and thus displacement between the first package and the second package can be suppressed even when executing re-reflow of the protruding electrodes at the time of mounting the first semiconductor package on a mother board.

Moreover, an electronic apparatus according to an embodiment of the present invention includes a first semiconductor package where a first semiconductor chip is mounted, a second semiconductor package where a second semiconductor chip is mounted, and a protruding electrode bonding the first semiconductor package and the second semiconductor package so that the second semiconductor package is held above the first semiconductor chip. The electronic apparatus also includes resin that is provided so as to avoid at least a part of the surface of the first semiconductor chip and is provided between the first semiconductor package and the second semiconductor package, a motherboard that mounts the first semiconductor package bonded to the second semiconductor package, and an electronic component bonded to the first semiconductor chip and the second semiconductor chip through the motherboard.

Accordingly, displacement of the semiconductor package at the time of mounting the first semiconductor package on the board can be prevented while suppressing the degradation of the reliability of the stacked semiconductor package, thereby the reliability of the electronic apparatus can be improved while enabling miniaturization and weight savings in the electronic apparatus.

Moreover, a method of manufacturing a semiconductor device according to an embodiment of the present invention includes: bonding a first semiconductor package where a first semiconductor chip is mounted and a second semiconductor package where a second semiconductor chip is mounted through protruding electrodes; and providing resin between the first semiconductor package and the second semiconductor package so as to avoid at least a part of the surface of the first semiconductor chip.

Accordingly a gap can be left between the first semiconductor package and the second semiconductor package that are bonded through the protruding electrodes even when resin is filled between the first semiconductor package and the second semiconductor package, thereby detachment between the first semiconductor package and the second semiconductor package can be suppressed while preventing displacement of the stacked semiconductor package at the time of mounting the stacked semiconductor package on a motherboard.

Moreover, as for a method of manufacturing a semiconductor device according to an embodiment of the present invention, the resin is arranged between the first semiconductor package and the second semiconductor package so as not to contact the protruding electrode. Accordingly, thermal damage can be suppressed even when executing a reflow process of the protruding electrode, thereby the thermal resistance of the resin can be lowered and low hygroscopic resin can be selected.

Moreover, as for a method of manufacturing a semiconductor device according to an embodiment of the present invention, the resin is arranged only at corners of the second semiconductor package. Accordingly, even when the gap between the first semiconductor package and the second semiconductor package is narrow, the resin can be filled between the first semiconductor package and the second semiconductor package, while suppressing complication of the manufacturing process.

A method of manufacturing a semiconductor device according to an embodiment of the present invention includes: providing flux that contains resin on lands formed on the first semiconductor package; arranging solder balls provided on a second semiconductor package on lands provided with the flux that contains resin; and melting the solder balls to bond the solder balls to the lands by executing a reflow process while making the resin, contained in the flux that contains resin, crawl up the surface of the solder balls.

Accordingly, by executing a reflow process of the solder balls, the resin can be arranged to contact the peripheries of the protruding electrodes, and thus detachment between the first semiconductor package and the second semiconductor package can be suppressed while the displacement at the time of mounting a stacked semiconductor package on a motherboard can be prevented without complicating the manufacturing process.

DETAILED DESCRIPTION

Figure 1:
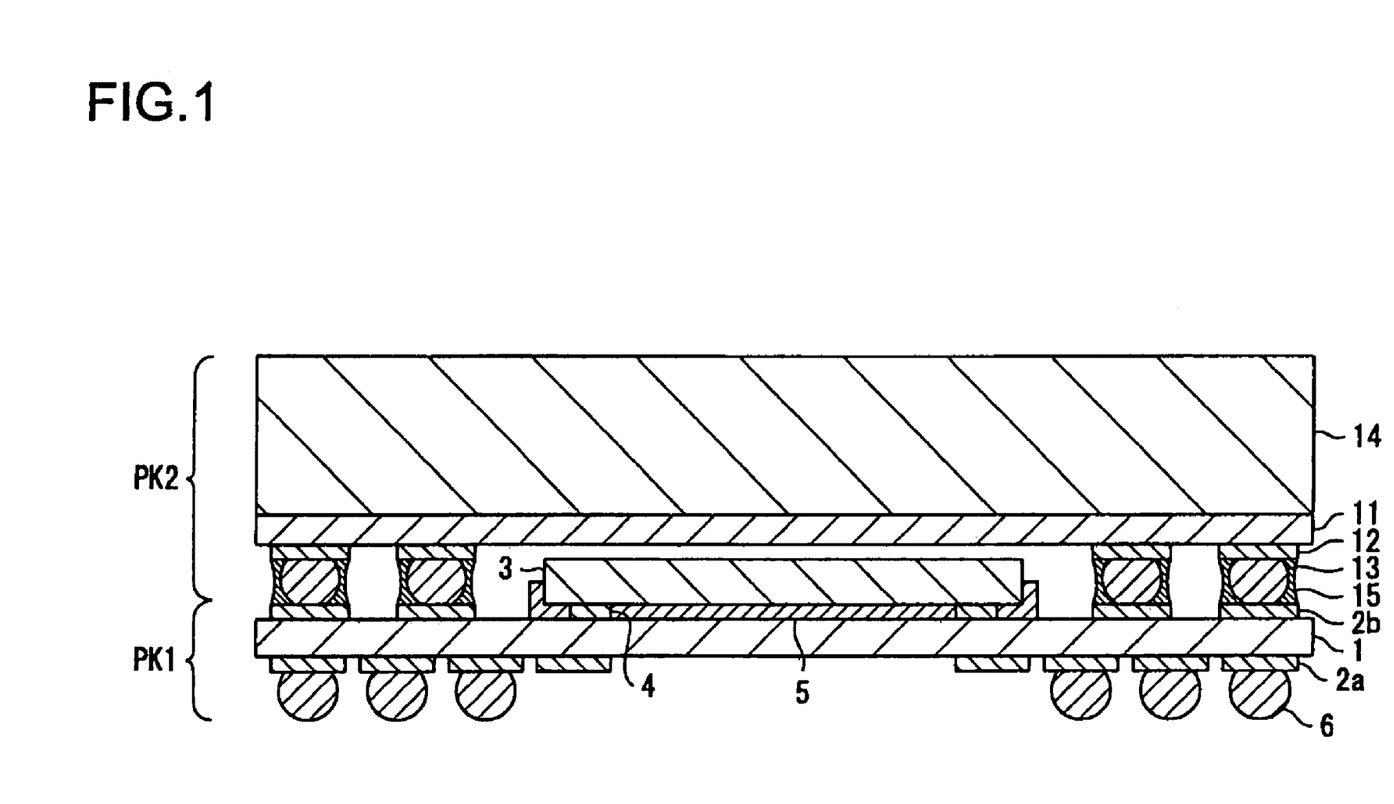
FIG. 1 shows a sectional view illustrating a schematic structure of a semiconductor device according to a first embodiment.

Hereinafter, a semiconductor device and a method of manufacturing the same according to embodiments of the present invention will be described with reference to drawings. FIG. 1 shows a sectional view illustrating an outline structure of a semiconductor device according to a first embodiment of the present invention.

In FIG. 1, a semiconductor package PK1 has a carrier substrate 1 provided therein, and lands 2a and 2b are formed on both surfaces of the carrier substrate 1. Then, on the carrier substrate 1, a semiconductor chip 3 is flip-chip mounted, and protruding electrodes 4 for flip-chip mounting are formed on the semiconductor chip 3. Then, the protruding electrodes 4, which are formed on the semiconductor chip 3, are bonded by ACF (Anisotropic Conductive Film) bonding to the lands 2b through an anisotropic conductive sheet 5.

On the other hand, a semiconductor package PK2 has a carrier substrate 11 provided therein, and lands 12 are formed on the back surface of the carrier substrate 11, and protruding electrodes 13 are formed on the lands 12. Moreover, a semiconductor chip (hidden from view) is mounted on the carrier substrate 11, and the carrier substrate 11, where the semiconductor chip is mounted, is sealed by sealing resin 14. In addition, on the carrier substrate 11, a semiconductor chip that is wire bonded may be mounted, or the semiconductor chip may be flip-chip mounted, or a stacked structure of semiconductor chips may be mounted.

Then, by bonding the protruding electrodes 13 to the lands 2b that are formed on the carrier substrate 1, the semiconductor package PK2 is mounted on the semiconductor package PK1 so that the carrier substrate 11 is arranged above the semiconductor chip 3. Moreover, resin 15 is provided between the semiconductor packages PK1 and PK2 so as not to contact the semiconductor chip 3. The resin 15 may be provided in the peripheries of the protruding electrodes 13 so as to contact each of the protruding electrodes 13.

Accordingly, the resin 15 can be filled between the semiconductor packages PK1 and PK2, leaving a gap between the semiconductor packages PK1 and PK2, which are bonded through the protruding electrodes 13. For this reason, the moisture contained in the resin between the semiconductor packages PK1 and PK2 can be easily drained out, thereby suppressing the resin 15 between the semiconductor packages PK1 and PK2 from expanding when executing re-reflow at the time of mounting the semiconductor package on a motherboard. Consequently, detachment between the semiconductor packages PK1 and PK2 can be suppressed, while enabling the semiconductor packages PK1 and PK2 to be firmly fixed with resin 15, and thus displacement between the semiconductor packages PK1 and PK2 can be suppressed even when executing re-reflow of the protruding electrodes 13 at the time of mounting the semiconductor package on a motherboard.

Moreover, even when the resin 15 is provided between the semiconductor packages PK1 and PK2 so as to leave a gap between the semiconductor packages PK1 and PK2 by providing the resin 15 in the peripheries of the protruding electrodes 13 while contacting each of the protruding electrodes 13, it is not necessary to leave a gap between the resin 15 and the protruding electrodes 13. For this reason, it is not necessary to secure a separate region for arranging the resin 15 against each of the protruding electrodes 13 between the semiconductor packages PK1 and PK2, and thus the resin 15 can be provided between the semiconductor packages PK1 and PK2 while suppressing the reduction of the number of arranged protruding electrodes 13.

In addition, as for the carrier substrates 1 and 11, for example, a double-sided substrate, a multilayer-interconnection substrate, a build-up substrate, a tape substrate, or a film substrate or the like can be used. As for the material of the carrier substrates 1 and 11, for example, a polyimide resin, a glass epoxy resin, BT resin, a composite of aramid and epoxy, a ceramic or the like can be used. Moreover, as for the protruding electrodes 4, 6 and 13, for example, Au bump, Cu bump and Ni bump covered with a solder material or the like, or a solder ball can be used.

Furthermore, when bonding the semiconductor packages PK1 and PK2 to each other through the protruding electrodes 13, metal bonding such as solder bonding and alloy bonding may be used or pressure-welding bonding such as ACF bonding, NCF (Nonconductive Film) bonding, ACP (Anisotropic Conductive Paste) bonding, and NCP (Nonconductive Paste) bonding may be used.

Figure 2A:
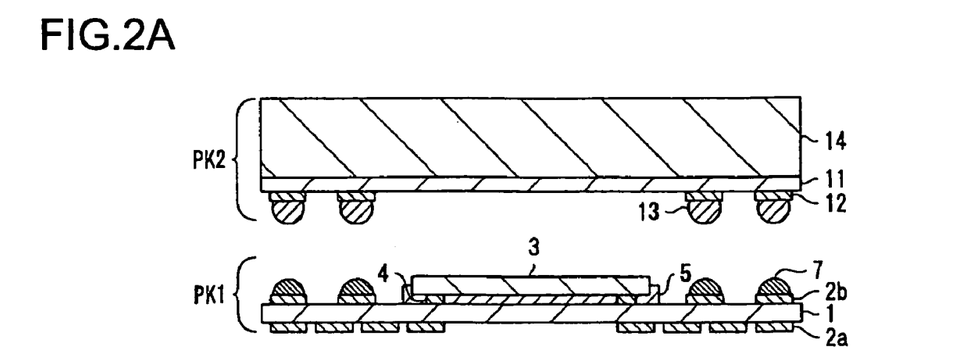
FIGS. 2A-D show sectional views illustrating an example of a method of manufacturing a semiconductor device of FIG. 1.

FIGS. 2A-D show sectional views illustrating an example of a method of manufacturing the semiconductor device of FIG. 1. In FIG. 2(a), when stacking the semiconductor package PK2 on the semiconductor package PK1, underfill flux 7 is provided on lands 2b of the carrier substrate 1, while forming solder balls as the protruding electrodes 13 on lands 12 of the semiconductor package PK2. The underfill flux 7 is resin mixed flux, and soldering and bonding can be executed simultaneously using thermosetting resin as a base.

Figure 2B:
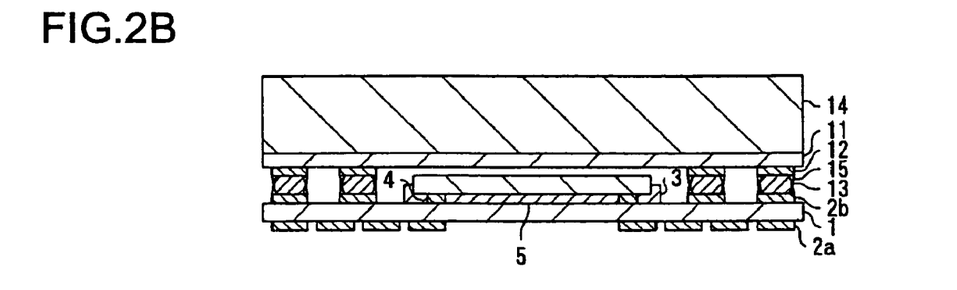

Next, as shown in FIG. 2(b), the semiconductor package PK2 is mounted on the semiconductor package PK1. Then, by executing a reflow process of the protruding electrodes 13, the protruding electrodes 13 are melted and the protruding electrodes 13 are bonded to the lands 2b, while making the resin contained in the underfill flux 7 crawl up (e.g., move, migrate, or the like) along the electrodes 13 so as to contact the peripheries of the protruding electrodes 13, thereby the resin 15 is formed between the semiconductor packages PK1 and PK2.

The resin 15 can be arranged to contact the peripheries of the protruding electrodes 13 by executing the reflow process of the protruding electrodes 13 by using the underfill flux 7, thereby enabling the resin 15 to be formed between the semiconductor packages PK1 and PK2 without complicating the manufacturing process. Moreover, underfill paste (solder paste containing thermosetting resin) may be used besides the underfill flux 7.

Figure 2C:
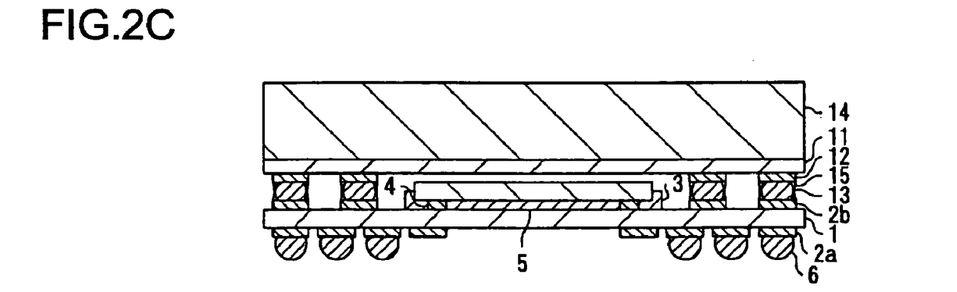

Moreover, by providing the resin 15 in the peripheries of the protruding electrodes 13, the resin 15 can be provided between the semiconductor packages PK1 and PK2 while securing space for releasing moisture contained in the resin 15, thereby the residual amount of moisture contained in the resin 15 can be reduced. Next, as shown in FIG. 2(c), protruding electrodes 6 for mounting the carrier substrate 1 on a motherboard 8 are formed on the lands 2a provided on the back surface of the carrier substrate 1.

Figure 2D:
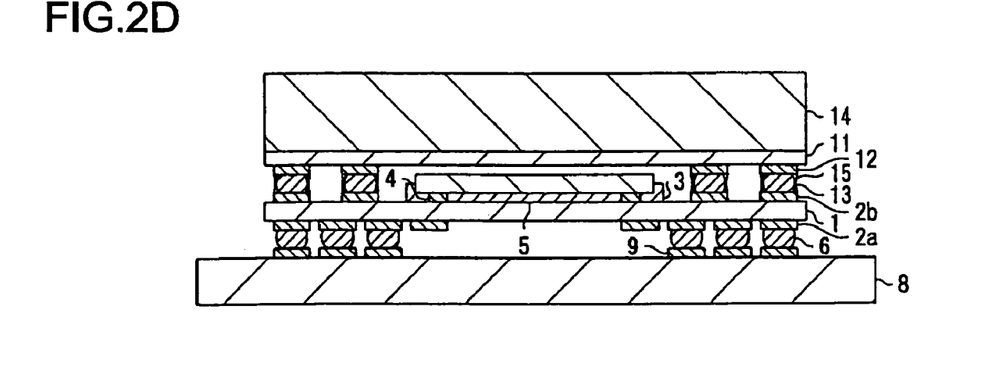

Next, as shown in FIG. 2(d), the carrier substrate 1 where the protruding electrodes 6 are formed is mounted on the motherboard 8. Then, the protruding electrodes 6 are bonded to lands 9 of the motherboard 8 by executing a reflow process of the protruding electrodes 6. In a condition that moisture contained in the resin 15 between the semiconductor packages PK1 and PK2 is almost all removed, the reflow process of the protruding electrodes 6 can be executed. Accordingly, the expansion of the resin 15 can be suppressed at the time of reflow of the protruding electrodes 6, thereby the semiconductor packages PK1 and PK2 can be prevented from being detached from each other. Moreover, even when executing re-reflow of the protruding electrodes 13 at the time of the reflow of the protruding electrodes 6, the condition that the semiconductor packages PK1 and PK2 are fixed to each other by the resin 15 can be maintained, and thus displacement between the semiconductor packages PK1 and PK2 can be prevented.

Moreover, although in the above-described embodiment, in order to mount the semiconductor package PK2 on the semiconductor package PK1, a method of forming the electrodes 13 on the land 12 of the carrier substrate 11, while providing the underfill flux on the lands 2b of the carrier substrate1 has been described, underfill flux 7 may be provided on the lands 12 of the carrier substrate 11 while forming the protruding electrodes 13 on the lands 2b of the carrier substrate. Moreover, although in the above-described embodiment, a method of providing the resin 15 in the peripheries of the protruding electrodes 13 so as to contact each of the protruding electrodes 13 by using the underfill flux 7 has been described, the underfill flux 7 is not necessarily so needed. For example, resin may be filled in the peripheries of the protruding electrodes 13 after having bonded the semiconductor packages PK1 and PK2 through the protruding electrodes 13. Moreover, although in the above-described embodiment, a method of providing the resin 15 in the peripheries of the protruding electrodes 13 so that the resin 15 is divided between the protruding electrodes 13 has been described, the resin may be connected between a plurality of the protruding electrodes 13. Moreover, although in the above-described embodiment, a method of providing the resin 15 in the peripheries of all the protruding electrodes 13 provided between the semiconductor packages PK1 and PK2 has been described, the resin may be provided in the peripheries of only some of the protruding electrodes 13 provided between the semiconductor packages PK1 and PK2. Furthermore, when providing the resin in the peripheries of the protruding electrodes 13, the protruding electrodes 13 may be bonded through a resin sheet, which has been formed corresponding to the positions for arranging the protruding electrodes 13.

Figure 3:
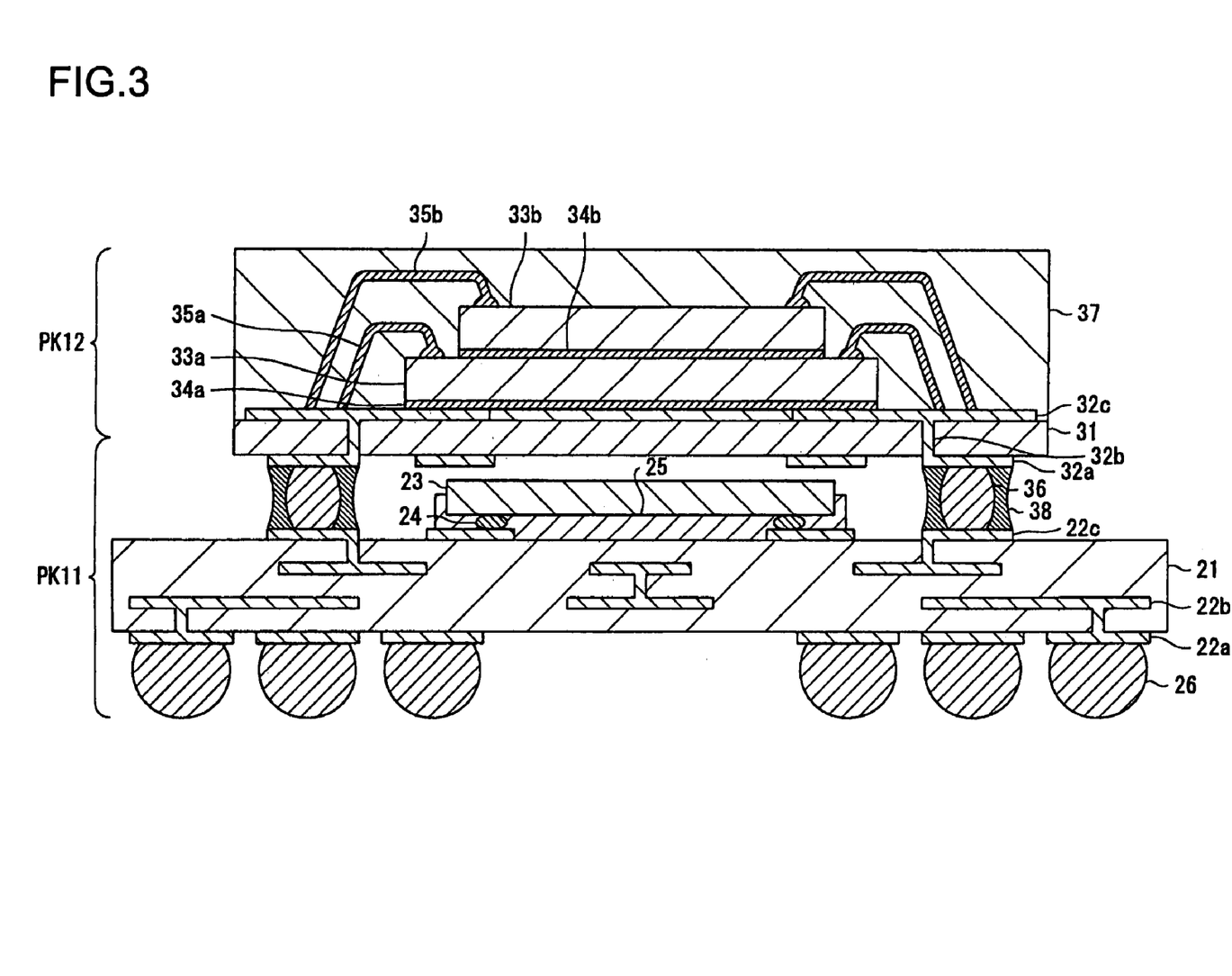
FIG. 3 shows a sectional view illustrating a schematic structure of a semiconductor device acceding to a second embodiment.

FIG. 3 shows a sectional view illustrating an outline structure of a semiconductor device according to a second embodiment of the present invention. In FIG. 3, a semiconductor package PK11 has a carrier substrate 21 provided therein and lands 22a and 22c are formed on both surfaces of the carrier substrate 21, and internal wirings 22b are formed inside the carrier substrate 21. Then, on the carrier substrate 21, a semiconductor chip 23 is flip-chip mounted, and protruding electrodes 24 for flip-chip mounting are formed on the semiconductor chip 23. Then, protruding electrodes 24, which are formed on the semiconductor chip 23, are bonded to the lands 22c by ACF bonding through an anisotropic conductive sheet 25. Moreover, on lands 22a formed on the back surface of the carrier substrate 21, protruding electrodes 26 for mounting the carrier substrate 21 on a motherboard are formed.

On the other hand, a semiconductor package PK12 has a carrier substrate 31 provided therein and lands 32a and 32c are formed on both surfaces of the carrier substrate 31, while internal wirings 32b are formed inside the carrier substrate 31. Then, on the carrier substrate 31, a semiconductor chip 33a is face-up mounted through a bonding layer 34a, and the semiconductor chip 33a is wire bonded to the lands 32c through_wire 35a. Furthermore, on the semiconductor chip 33a, a semiconductor chip 33b is face-up mounted, avoiding the conductive wire 35a, and the semiconductor chips 33b is fixed on the semiconductor chips 33a through an bonding layer 34b, while being wire-bonded to the lands 32c through conductive wire 35b.

Moreover, on the lands 32a formed on the back surface of the carrier substrate 31, protruding electrodes 36 for mounting the carrier substrate 31 on the carrier substrate 21 are formed so as to hold the carrier substrate 31 above the semiconductor chip 23. The protruding electrodes 36 are arranged to avoid the region for mounting the semiconductor chip 23, and for example, the protruding electrodes 36 may be arranged in the periphery of the back surface of the carrier substrate 31. Then, the carrier substrate 31 is mounted on the carrier substrate 21 by bonding the protruding electrodes 36 to the lands 22c formed on the carrier substrate 21.

Moreover, sealing resin 37 is provided on a surface of the carrier substrate 31, which is the mounting side of the semiconductor chips 33a and 33b, and the semiconductor chips 33a and 33b are sealed by the sealing resin 37. When sealing the semiconductor chips 33a and 33b by the sealing resin 37, molding, which uses a thermosetting resin such as an epoxy resin, can be executed.

Moreover, resin 38 is provided between the carrier substrates 21 and 31, which are bonded through the protruding electrodes 36 so as to leave space between the carrier substrates 21 and 31. The resin 38 can be provided in the peripheries of the protruding electrodes 36 so as to contact each of the protruding electrodes 36. Accordingly, when stacking different types of packages, the resin 38 can be provided between the carrier substrates 21 and 31 in a condition that the gap is left between the carrier substrates 21 and 31, which are bonded through the protruding electrodes 36. Therefore, space savings at the time of mounting different sizes or types of semiconductor chips 23, 33a, and 33b can be attained. Furthermore, detachment between the semiconductor packages PK11 and P12 can be suppressed, while preventing displacement at the time of mounting the stacked semiconductor packages PK11 and P12 on a motherboard.

Figure 4:
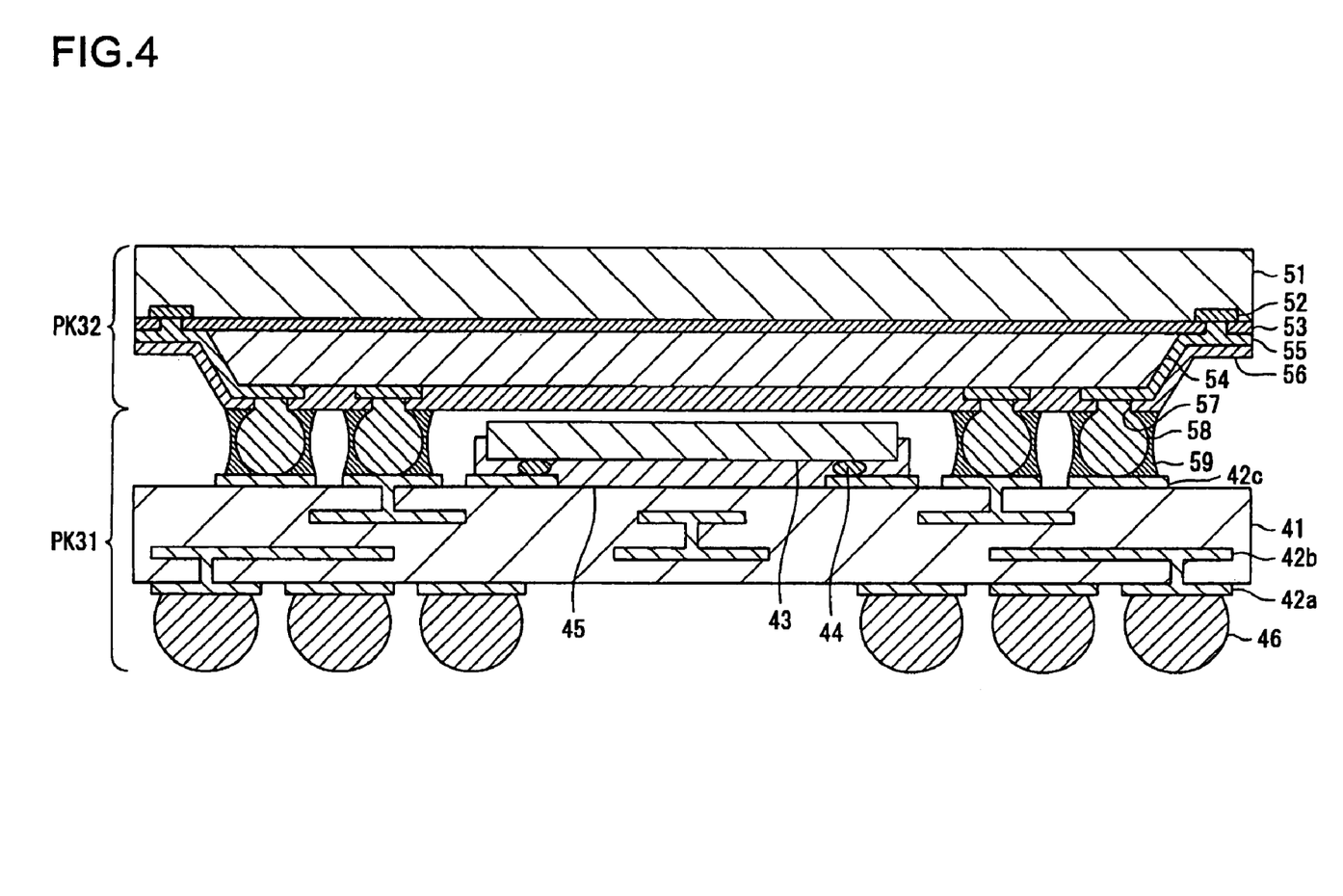
FIG. 4 shows a sectional view illustrating a schematic structure of a semiconductor device according to a third embodiment.

FIG. 4 shows a sectional view illustrating an outline structure of a semiconductor device according to a third embodiment of the present invention. In FIG. 4, a semiconductor package PK31 has a carrier substrate 41 provided therein and lands 42a and 42c are formed on both surfaces of the carrier substrate 41, and internal wirings 42b are formed inside the carrier substrate 41. Then, on the carrier substrate 41, a semiconductor chip 43 is flip-chip mounted, and protruding electrodes 44 for flip-chip mounting are formed on the semiconductor chip 43. Then, the protruding electrodes 44, which are formed on the semiconductor chip 43, are bonded to the lands 42c by ACF bonding through an anisotropic conductive sheet 45. Moreover, on the lands 42a formed on the back surface of the carrier substrate 41, protruding electrodes 46 for mounting the carrier substrate 41 on a motherboard are formed.

On the other hand, a semiconductor package PK32 has a semiconductor chip 51 provided therein and the semiconductor chip 51 has electrode pads 52 provided thereon, while an insulating layer 53 is formed so that the electrode pads 52 are exposed. Then, on the semiconductor chip 51, a stress-relieving layer 54 is formed so that the electrode pads 52 are exposed. Furthermore, on the electrode pads 52, re-routing wirings 55, which are extended on the stress-relieving layer 54, are formed. Then, on the re-routing wirings 55, a solder-resist film 56 is formed, and on the solder-resist film 56, an opening 57, which exposes the re-routing wirings 55 on the stress-relieving layers 54, is formed. Then, on the re-routing wirings 55, which are exposed through the opening 57, protruding electrodes 58 for face-down mounting the semiconductor chip 51 on the carrier substrate 41 are formed so that the semiconductor package PK32 is held above the semiconductor chip 43.

The protruding electrodes 58 can be arranged to avoid the region for mounting the semiconductor chip 43. For example, the protruding electrodes 58 can be arranged in the periphery of the semiconductor chip 51. Then, the protruding electrodes 58 are bonded on the lands 42c formed on the carrier substrate 41, and the semiconductor package PK32 is mounted on the carrier substrate 41. Moreover, resin 59 is provided between the carrier substrate 41 and the semiconductor chip 51, which are bonded through the protruding electrodes 58, so as to leave space between the carrier substrate 41 and the semiconductor chip 51. The resin 59 may be provided in the peripheries of the protruding electrodes 58, contacting each of the protruding electrodes 58.

Accordingly, even when stacking a W-CSP (wafer level-chip-size package) on the semiconductor package PK31, the resin 59 can be provided between the carrier substrate 41 and the semiconductor chip 51 in a condition that a gap is left between the carrier substrates 41 and the semiconductor chips 51, which are bonded through protruding electrodes 58. Therefore, even in the case that types or sizes of the semiconductor chips 43 and 51 are different, the semiconductor chip 51 can be three-dimensionally mounted above the semiconductor chip 43 without interposing a carrier substrate between the semiconductor chips 43 and 51. Furthermore, this enables the suppression of detachment between the semiconductor packages PK31 and PK32, while preventing displacement of the stacked semiconductor packages PK31 and PK32 at the time of mounting on a motherboard. Consequently, degradation of the reliability of the semiconductor chips 43 and 51, which are three-dimensionally mounted, can be suppressed, and increase of the height at the time of stacking the semiconductor chips 43 and 51 can be suppressed, thereby space savings at the time of mounting the semiconductor chips 43 and 51 can be attained.

Figure 5:
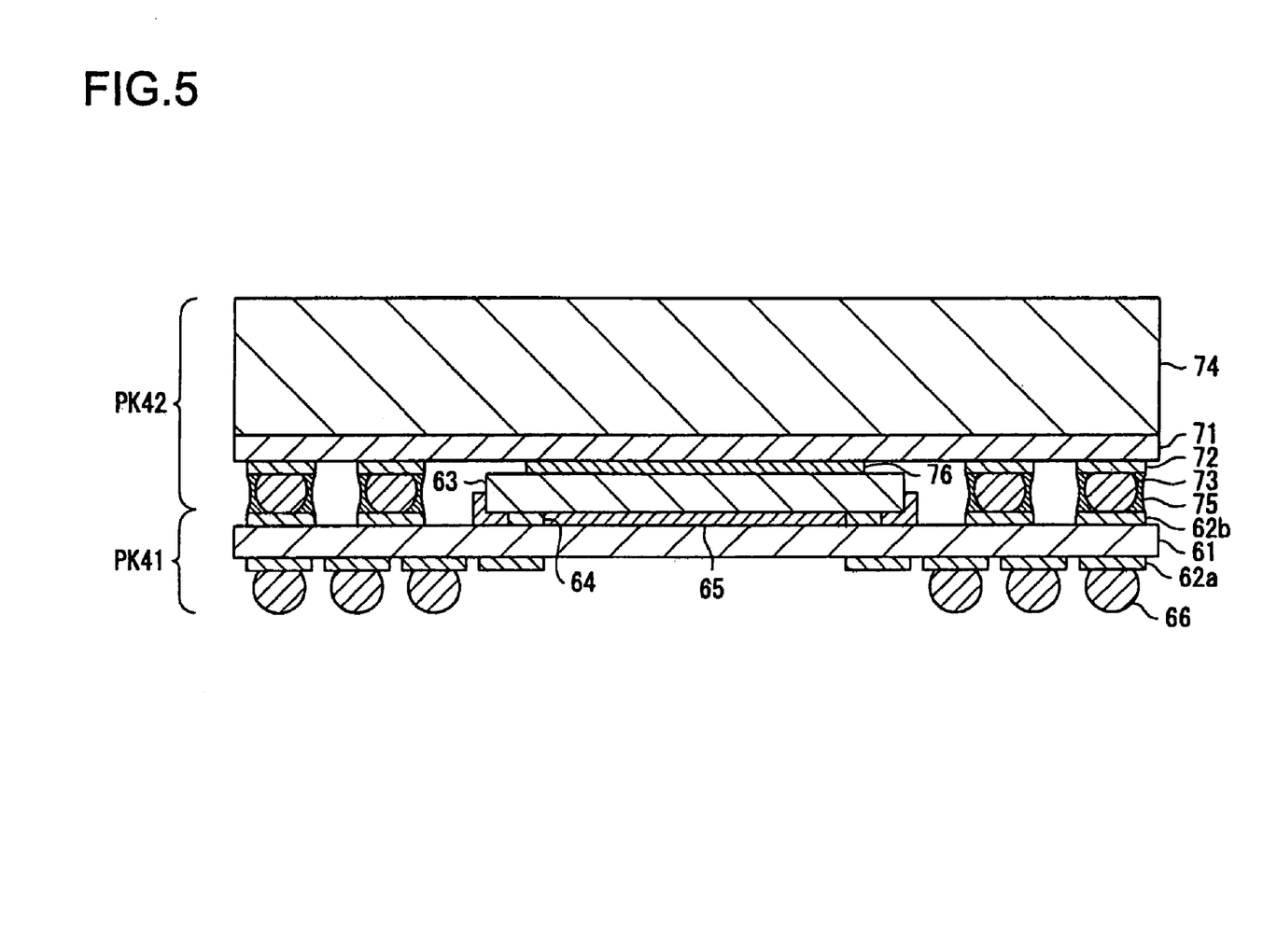
FIG. 5 shows a sectional view illustrating a schematic structure of a semiconductor device according to a fourth embodiment.

FIG. 5 shows a sectional view illustrating an outline structure of a semiconductor device according to a fourth embodiment of the present invention. In FIG. 5, a semiconductor package PK41 has a carrier substrate 61 provided therein, and lands 62a and 62b are formed on both surfaces of the carrier substrate 61. Then, on the carrier substrate 61, a semiconductor chip 63 is flip-chip mounted, and protruding electrodes 64 for flip-chip mounting are formed on the semiconductor chip 63. Then, protruding electrodes 64, which are formed on the semiconductor chip 63, are bonded to the lands 62b by ACF bonding through an anisotropic conductive sheet 65.

On the other hand, a semiconductor package PK42 has a carrier substrate 71 provided therein, and lands 72 are formed on the back surface of the carrier substrate 71, and protruding electrodes 73 are formed on the lands 72. Moreover, a semiconductor chip (hidden from view) is mounted on the carrier substrate 71, and the carrier substrate 71 where the semiconductor chip is mounted is sealed by sealing resin 74. On the carrier substrate 71, a semiconductor chip which is wire bonded may be mounted, or a semiconductor chip may be flip-chip mounted, or a stacked structure of semiconductor chips may be mounted.

Then, by bonding the protruding electrodes 73 on the lands 62b that are formed on the carrier substrate 61, the semiconductor package PK42 is mounted on the semiconductor package PK41 so that the carrier substrate 71 is arranged above the semiconductor chip 63. Resin 76 is provided between the semiconductor package PK42 and the semiconductor chip 63, and the semiconductor package PK42 and the semiconductor chip 63 are fixed through the resin 76.

Moreover, resin 75 is provided between the semiconductor packages PK41 and PK42, and the resin 75 can be provided in the peripheries of the protruding electrodes 73, contacting each of the protruding electrodes 73. Accordingly, the resin 75 can be provided between the semiconductor packages PK41 and PK42 in a condition that a gap is left between the semiconductor packages PK41 and PK42, which are bonded through the protruding electrodes 73, and the bonding strength between the semiconductor packages PK41 and PK42 can be reinforced by the resin 76. For this reason, even in the case where quantity of the resin 75 provided between the semiconductor packages PK41 and PK42 is small, displacement between the semiconductor packages PK41 and PK42 can be prevented when executing re-reflow of the protruding electrodes 73 at the time of mounting on a motherboard. Moreover, detachment between the semiconductor packages PK41 and PK42 can be suppressed by suppressing the resin 75 between the semiconductor packages PK41 and PK42 from expanding when executing a reflow of the protruding electrodes 66 at the time of mounting on a motherboard.

Figure 6:
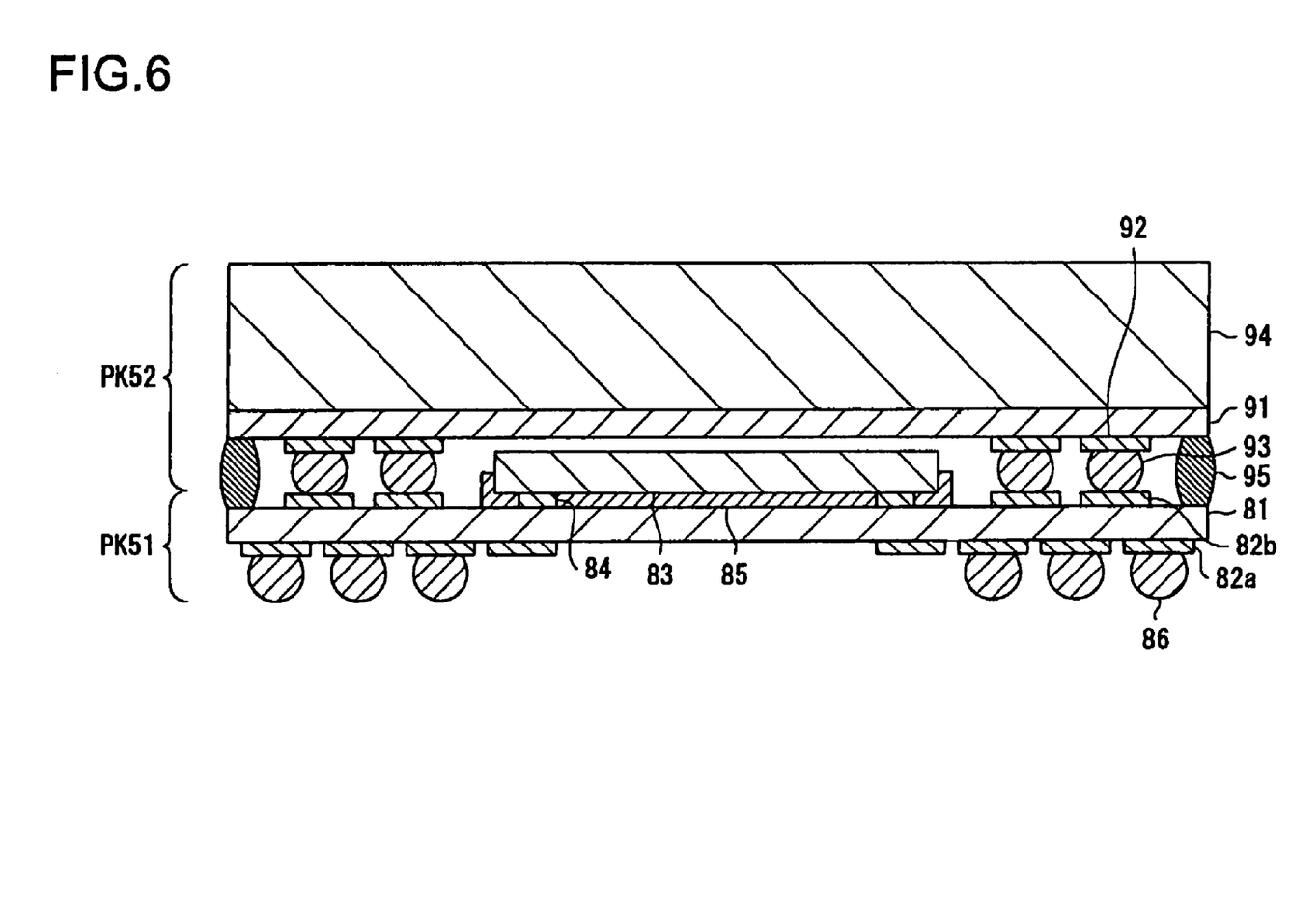
FIG. 6 shows a sectional view illustrating a schematic structure of a semiconductor device according to a fifth embodiment.

FIG. 6 shows a sectional view illustrating an outline structure of a semiconductor device according to a fifth embodiment of the present invention. In FIG. 6, a semiconductor package PK51 has a carrier substrate 81 provided therein, and lands 82a and 82b are formed on both surfaces of the carrier substrate 81. Then, on the carrier substrate 81, a semiconductor chip 83 is flip-chip mounted, and protruding electrodes 84 for flip-chip mounting are formed on the semiconductor chip 83. Then, the protruding electrodes 84, which are formed on the semiconductor chip 83, are bonded to the lands 82b by ACF bonding through an anisotropic conductive sheet 85.

On the other hand, a semiconductor package PK52 has a carrier substrate 91 provided therein, and lands 92 are formed on the back surface of the carrier substrate 91, and protruding electrodes 93 are formed on the lands 92. Moreover, a semiconductor chip (hidden from view) is mounted on the carrier substrate 91, and the carrier substrate 91 where the semiconductor chip is mounted is sealed by sealing resin 94. On the carrier substrate 91, a semiconductor chip which is wire bonded may be mounted, or a semiconductor chip may be flip-chip mounted, or a stacked structure of semiconductor chips may be mounted.

Then, by bonding protruding electrodes 93 on the lands 82b that are formed on a carrier substrate 81, the semiconductor package PK52 is mounted on the semiconductor package PK51 so that the carrier substrate 91 is arranged above the semiconductor chip 83. Moreover, resin 95 is provided between the semiconductor packages PK51 and PK52 so as not to contact the protruding electrodes 93, and the resin 95 can be arranged only at the four corners of the semiconductor package PK52, for example. The resin 95 may also be arranged along the sides of the semiconductor package PK52.

Accordingly, in a condition that a gap is left between the semiconductor packages PK51 and PK52, which are bonded through the protruding electrodes 93, the resin 95 can be provided between the semiconductor packages PK51 and PK52, while thermal damage to the resin 95 can be suppressed even when executing a reflow process of the protruding electrodes 93. Therefore, thermal resistance of the resin 95 can be reduced and a low hygroscopic resin can be selected, thereby the reliability of the stacked semiconductor packages PK51 and PK52 can be improved.

In addition, in order to provide the resin 95 between the semiconductor packages PK51 and PK52 so as not to contact the protruding electrodes 93, a region without a protruding electrode corresponding to the positions for arranging the resin 95 can be provided. Accordingly, even when the protruding electrodes 93 are densely arranged, the resin 95 can be filled between the semiconductor packages PK51 and PK52 without contacting the protruding electrodes 93. For this reason, multi-pin packaging of the semiconductor packages PK51 and PK52 can be supported, while displacement of the stacked semiconductor packages PK51 and PK52 at the time of mounting on a motherboard can be prevented. Furthermore, detachment between the semiconductor packages PK51 and PK52 can be suppressed.

Figure 7A:
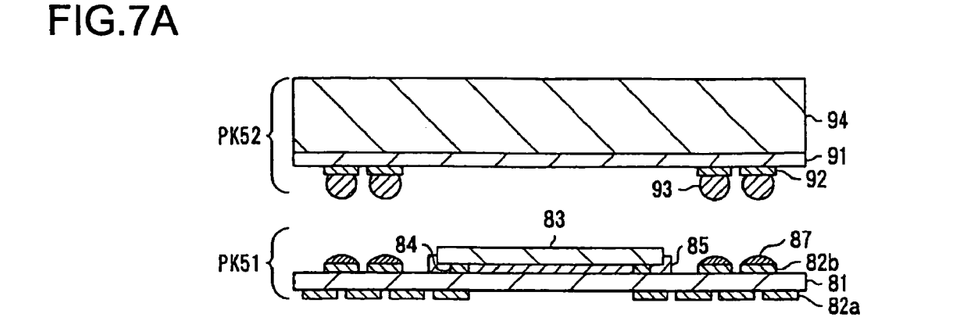
FIGS. 7A-D show sectional views illustrating an example of a method of manufacturing a semiconductor device of FIG. 6.

FIGS. 7A-D show sectional views illustrating an example of a method of manufacturing the semiconductor device of FIG. 6. In FIG. 7(a), when stacking the semiconductor package PK52 on the semiconductor package PK51, solder balls are formed on the lands 92 of the semiconductor package PK52, while flux 87 is provided on lands 82b of the carrier substrate 81. Solder paste instead of the flux 87 may be provided on the land 82b of the carrier substrate 81.

Figure 7B:
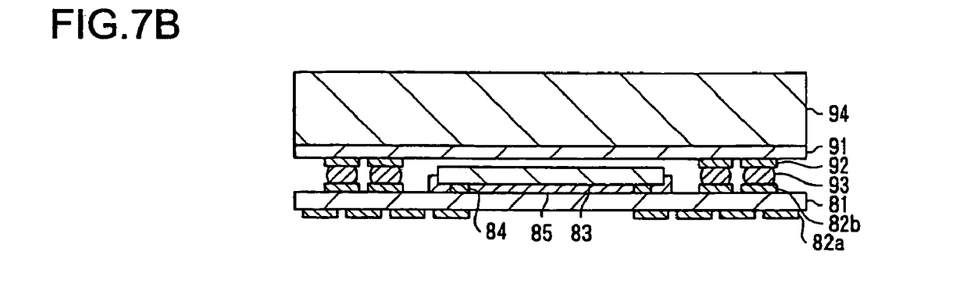
Figure 7C:
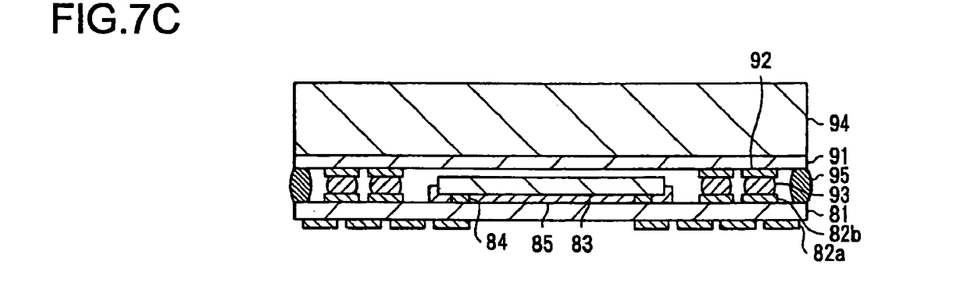

Next, as shown in FIG. 7(b), the semiconductor package PK52 is mounted on the semiconductor package PK51. Then, the protruding electrodes 93 are melted by executing a reflow process of the protruding electrodes 93, thereby the protruding electrodes 93 are bonded on the lands 82b. Next, as shown in FIG. 7(c), by using a dispenser or the like, the resin 95 is injected between the semiconductor packages PK51 and PK52 so as not to contact the protruding electrodes 93, and then resin 95 is cured.

By providing the resin 95 between the semiconductor packages PK51 and PK52 so as not to contact the protruding electrodes 93, a gap for accommodating and releasing moisture contained in the resin 95 can be secured, thereby the residual amount of moisture contained in the resin 15 can be reduced, while the semiconductor package of PK51 and PK52 can be fixed by the resin 95.

Figure 7D:
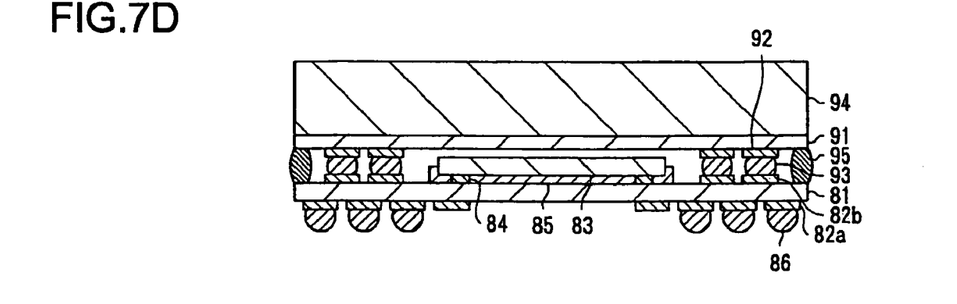

Next, as shown in FIG. 7(d), protruding electrodes 86 for mounting the carrier substrate 81 on a motherboard are formed on the lands 82a formed on the back surface of the carrier substrate 81. Then, the stacked structure of the semiconductor packages PK51 and PK52 can be mounted on the motherboard by mounting the carrier substrate 81, where the protruding electrodes 86 are formed, on the motherboard, and executing a reflow process of the protruding electrodes 86.

The reflow process of the protruding electrodes 86 can be executed in a condition that moisture contained in the resin 95 between the semiconductor packages PK51 and PK52 is almost all removed. Accordingly, the expansion of the resin 95 can be suppressed at the time of reflow of the protruding electrodes 86, thereby the semiconductor packages PK51 and PK52 can be prevented from being detached from each other. Moreover, even when executing re-reflow of the protruding electrodes 93 at the time of the reflow of the protruding electrodes 86, a condition that the semiconductor packages PK51 and PK52 are fixed to each other by the resin 95 can be maintained, and thus displacement between the semiconductor packages PK51 and PK52 can be prevented.

Figure 8A:
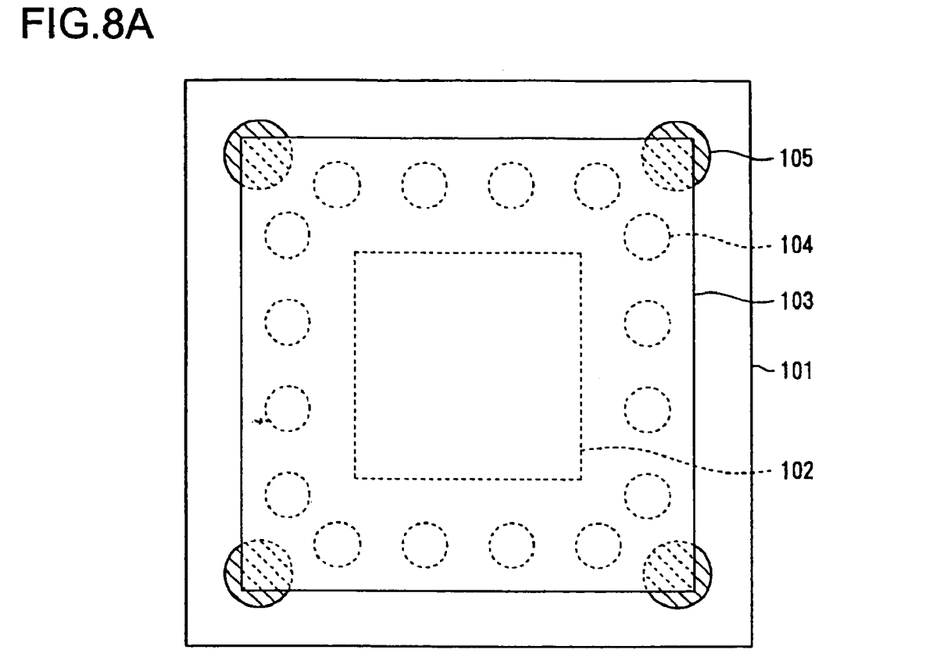
FIGS. 8A-B show plan views illustrating schematic structures of semiconductor devices according to a sixth and a seventh embodiments.
Figure 8B:
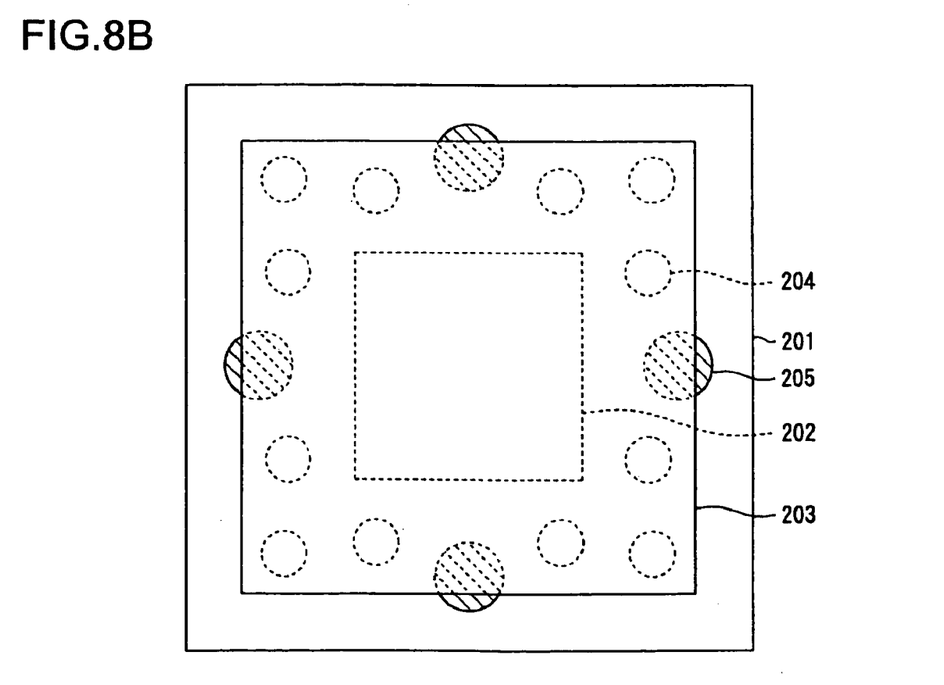

FIG. 8(a) shows a plan view illustrating an outline structure of a semiconductor device according to a sixth embodiment. FIG. 8(b) shows a plan view illustrating an outline structure of a semiconductor device according to a seventh embodiment of the present invention. In FIG. 8(a), a semiconductor chip 102 is mounted on a semiconductor package 101. Then, a semiconductor package 103 is mounted on the semiconductor package 101 so as to be held above the semiconductor chip 102 through protruding electrodes 104.

Moreover, resin 105 is provided between the semiconductor packages 101 and 103, and the resin 105 is provided at the four corners of the semiconductor package 103 so as not to contact the protruding electrodes 104. Moreover, the protruding electrodes 104 are arranged on the semiconductor package 103, avoiding the region for arranging the resin 105. Accordingly, even when the gap between the semiconductor packages 101 and 103 is narrow, the resin 105 can be easily filled between the semiconductor packages 101 and 103. For this reason, displacement of the stacked semiconductor package of 101 and 103 at the time of mounting on a motherboard can be prevented, while suppressing complication of the manufacturing process, thereby detachment between the semiconductor packages 101 and 103 can be suppressed. Moreover, by arranging the resin 105 at the four corners of the semiconductor package 103, stress applied to the semiconductor package 103 can be efficiently absorbed by the resin 105, thereby impact resistance of the semiconductor package 103 can be improved.

In FIG. 8(b), a semiconductor chip 202 is mounted on a semiconductor package 201. Then, a semiconductor package 203 is mounted on the semiconductor package 201 so as to be held above the semiconductor chip 202 through protruding electrodes 204. Then, resin 205 is provided between the semiconductor packages 201 and 202, and the resin 205 is provided along (e.g., in the center of) the sides of the semiconductor package 203 so as not to contact the protruding electrodes 204. Moreover, the protruding electrodes 204 are arranged on the semiconductor package 203, avoiding the region for arranging the resin 205.

Accordingly, even when the gap between the semiconductor packages 201 and 203 is narrow, the resin 205 can be filled between the semiconductor packages 201 and 203. For this reason, displacement of the stacked semiconductor packages 201 and 203 at the time of mounting on a motherboard can be prevented, while suppressing complication of the manufacturing process. Furthermore detachment between the semiconductor packages 201 and 203 can be suppressed.

Figure 9A:
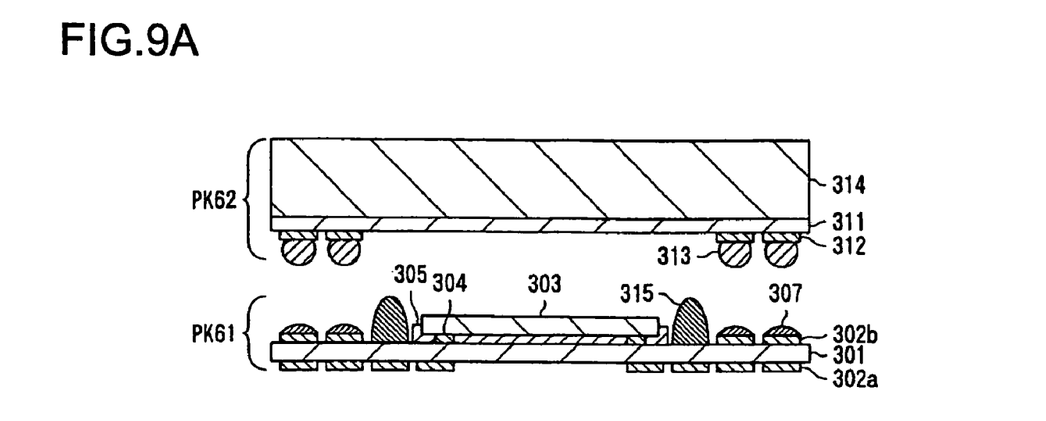
FIGS. 9A-C show sectional views illustrating an example of a method of manufacturing a semiconductor device according to an eighth embodiment.

FIGS. 9A-C show sectional views illustrating an example of a method of manufacturing a semiconductor device according to an eighth embodiment of the present invention. In FIG. 9(a), a semiconductor package PK61 has a carrier substrate 301 provided therein, and lands 302a and 302b are formed on both surfaces of the carrier substrate 301. Then, on the carrier substrate 301, a semiconductor chip 303 is flip-chip mounted, and protruding electrodes 304 for flip-chip mounting are formed on the semiconductor chip 303. Then, the protruding electrodes 304, which are formed on the semiconductor chip 303, are bonded to lands 302b by ACF bonding through an anisotropic conductive sheet 305.

On the other hand, a semiconductor package PK62 has a carrier substrate 311 provided therein, and lands 312 are formed on the back surface of the carrier substrate 311, and protruding electrodes 313 are formed on the lands 312. Moreover, a semiconductor chip (hidden from view) is mounted on the carrier substrate 311, and the carrier substrate 311, where the semiconductor chip is mounted, is sealed by sealing resin 314.

Then, when stacking a semiconductor package PK62 on a semiconductor package PK61, solder balls as protruding electrodes 313 are formed on the lands 312 of the semiconductor package PK62, while flux 307 is provided on the lands 302b of the carrier substrate 301. Solder paste instead of the flux 307 may be provided on the land 302b of the carrier substrate 301. Moreover, resin 315 is provided to the region where lands 302b are not arranged on the carrier substrate 301 by using a dispenser or the like.

Figure 9B:
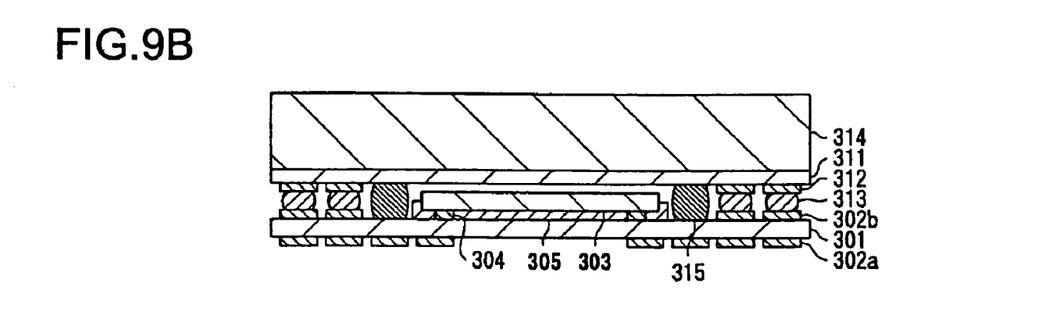

Next, as shown in FIG. 9(b), the semiconductor package PK62 is mounted on the semiconductor package PK61. Then, the protruding electrodes 313 are melted by executing a reflow process of the protruding electrodes 313, thereby the protruding electrodes 313 are bonded to the lands 302b. When bonding the protruding electrodes 313 to the lands 302b, it is preferable to maintain resin 315 in an A-stage condition (a condition that resin softens by increasing temperature), or a B-stage condition (a condition that resin viscosity becomes high by increasing temperature). Accordingly, the protruding electrodes 313 can be arranged relative to the lands 302b in self-aligned manner by the surface tension when the protruding electrodes 313 are melted, thereby the semiconductor package PK62 can be arranged with a sufficient precision on the semiconductor package PK61. Then, after the protruding electrodes 313 have been bonded to the lands 302b, the resin 315 is cured at a temperature lower than the temperature at the time of the reflow of the protruding electrodes 313, and the resin 315 is made to shift to a C-stage condition (a cured condition).

By providing the resin 315 in a part of the gap between the semiconductor packages PK61 and PK62, a gap for accommodating and releasing moisture contained in the resin 315 can be secured, thereby the residual amount of moisture contained in the resin 15 can be reduced, while enabling the semiconductor packages PK61 and PK62 to be fixed by the resin 315.

Moreover, by providing the resin 315 on the semiconductor package PK61 before stacking the semiconductor package PK62 on the semiconductor package PK61, even in cases where the gap between the semiconductor packages PK61 and PK62 is narrow after the stacking, the resin 315 can be easily arranged to arbitrary positions between the semiconductor packages PK61 and PK62. For this reason, the resin 315 can be easily provided in a part, which is between the semiconductor packages PK61 and PK62, considering various factors like positions for arranging the semiconductor chip 303 and the protruding electrodes 313, and stress applied to the semiconductor packages PK61 and PK62 or the like, thereby the reliability of the stacked structure of the semiconductor package of PK61 and PK62 can be improved while suppressing complication of the manufacturing process.

Figure 9C:
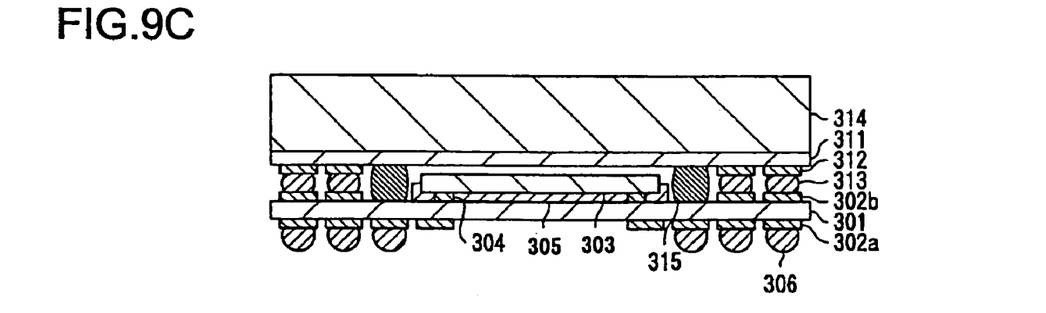

Next, as shown in FIG. 9(c), protruding electrodes 306 for mounting a carrier substrate 301 on a motherboard are formed on the lands 302a formed on the back surface of the carrier substrate 301. Then, the stacked structure of the semiconductor packages PK61 and PK62 can be mounted on the motherboard by mounting the carrier substrate 301, where the protruding electrodes 306 are formed, on the motherboard, and executing a reflow process of the protruding electrodes 306.

The reflow process of the protruding electrodes 306 can be executed in a condition that moisture contained in the resin 315 between the semiconductor packages PK61 and PK62 is almost all removed. Accordingly, the expansion of the resin 315 can be suppressed at the time of reflow of the protruding electrodes 306, thereby the semiconductor packages PK61 and PK62 can be prevented from being detached from each other. Moreover, even when executing re-reflow of the protruding electrodes 313 at the time of the reflow of the protruding electrodes 306, the condition that the semiconductor packages PK61 and PK62 are fixed to each other by the resin 315 can be maintained, and thus displacement between the semiconductor packages PK61 and PK62 can be prevented.

The above-described semiconductor devices are applicable to electronic apparatus such as a liquid crystal display device, a cellular phone, Personal Digital Assistant, a video camera, a digital camera, and an MD (Mini Disc) player, and enable miniaturization and weight savings of the electronic apparatus to be attained, while enabling the reliability of the electronic apparatus to be improved. Although in the above-described embodiments, methods of stacking semiconductor packages have been described as examples, the present invention is not necessarily limited to the methods of stacking semiconductor packages, and others, including a ceramic element such as a surface acoustic wave (SAW) element, optical elements such as a light modulator and an optical switch, and various sensors such as a magnetic sensor, and a bio-sensor, may be stacked, for example.

What is claimed is:

1. A method of manufacturing a semiconductor device, comprising:

providing flux, which contains resin, on lands formed on a first semiconductor package;

arranging solder balls, provided on a second semiconductor package, on lands provided with the flux; and melting the solder balls to bond the solder balls to the lands by executing a reflow process while making the resin contained in the flux crawl up along surfaces of the solder balls during the reflow process.

2. A method of manufacturing a semiconductor device, comprising:

providing flux, which contains resin, on lands formed on a first semiconductor package;

arranging solder balls, provided on a second semiconductor package, on lands provided with the flux; and melting the solder balls to bond the solder balls to the lands by executing a reflow process while simultaneously making the resin contained in the flux crawl up along surfaces of the solder balls during the reflow process.

* * * * *